April 15, 1969 T. P. SYLVAN 3,439,237

ANALOGUE UNIJUNCTION DEVICE

Filed Oct. 31, 1966

INVENTOR:
TAGE P. SYLVAN,
BY Robert J. Mooney
HIS ATTORNEY.

3,439,237
ANALOGUE UNIJUNCTION DEVICE

Tage P. Sylvan, Liverpool, N.Y., assignor to General Electric Company, a corporation of New York Filed Oct. 31, 1966, Ser. No. 590,818
Int. Cl. H01l 9/12
U.S. Cl. 317—235 9 Claims This invention relates to semiconductor unijunction transistors and more specifically to an analogue unijunction semiconductor device.

A unijunction transistor is a three-terminal semiconductor device including one emitter electrode and two base electrodes which are commonly referred to as the base one and base two electrodes. A voltage $V_{BB}$ is usually applied across the base one and the base two terminals and a voltage $V_P$ is applied at the emitter terminal. In one mode of operation, the emitter voltage may vary until it reaches a magnitude proportional to a certain fraction of the interbase voltage, at which point the resistance between the emitter and the base one electrode decreases to a very low value. This point could be called a switching or firing point inasmuch as at this point conduction is initiated between the emitter and the base one. The voltage at this point is called the peak point emitter voltage and the fraction which is multiplied by the inter-base voltage to yield the peak point emitter voltage is called Eta or the intrinsic standoff ratio. After the firing point is reached, the voltage between emitter and base one drops rapidly to a minimal value commonly referred to as the valley point voltage.

The need exists for a semiconductor unijunction transistor device, commonly used in switching circuits and other types of electronic circuits, which possesses improved characteristics over those types presently available. Some characteristics of present day unijunction transistors which need to be improved for today's more sophisticated circuits are the following. Various parameters of unijunction transistors need to be more uniform from one device to another device in order to reduce the need for special adjustments and trimming during the production of electronic circuits and also to facilitate interchangeability in field servicing of these circuits. One of the most important parameters which it is desired to make more uniform is the intrinsic standoff ratio of the unijunction transistor.

Conventional unijunction transistors are hampered by instability problems with variations in temperature which may hinder the performance of time delay and oscillator circuits connected to the unijunction transistor. Also, the emitter saturation voltage, i.e. the diode voltage between emitter and base one after the valley point is reached, may be undesirably high and may vary from unit to unit in conventional unijunction transistors, thereby limiting the pulse current capability of the transistor and its switching efficiency. It would be desirable to decrease instabilities and to lower the emitter saturation voltage. Additionally, it would be desirable to increase the switching speed of the transistor so that higher frequencies may be employed. Finally, for circuit design flexibility, it would be desirable to provide a method of manufacture of unijunction devices in which both PN and NP transistors with similar operating characteristics are obtained.

It is, therefore, an object of this invention to provide a semiconductor device with improved unijunction transistor characteristics.

It is another object of this invention to provide a semiconductor unijunction device with greater uniformity of characteristics, particularly the intrinsic standoff ratio.

It is still another object of this invention to provide a semiconductor device exhibiting unijunction transistor characteristics which is relatively stable with temperature variations.

It is a further object of this invention to provide a semiconductor unijunction transistor device with a lower emitter saturation voltage than has heretofore been achievable.

It is a still further object of this invention to provide a semiconductor unijunction transistor device which exhibits a faster switching time than heretofore has been achievable.

It is yet still another object of this invention to provide a method of manufacturing semiconductor devices exhibiting unijunction transistor characteristics, which method may be employed for complementary types of transistors.

Briefly, these objects are obtained in an integrated semiconductor device which includes four semiconductor layers and a pair of resistances forming a resistance divide, which device is an analogue of a unijunction transistor. By controlling the introduction of the P and N type of impurities in the integrated device and by controlling the electrical resistances thereof, a device exhibiting unijunction characteristics and with the abovementioned desiderata is achieved.

The invention will be particularly pointed out and distinctly claimed in the appended claims. The invention both with respect to the device and the method of making the device, together with further objects and advantages thereof, may be understood with reference to the following description taken in conjunction with the accompanying drawings in which:

Figure 5:
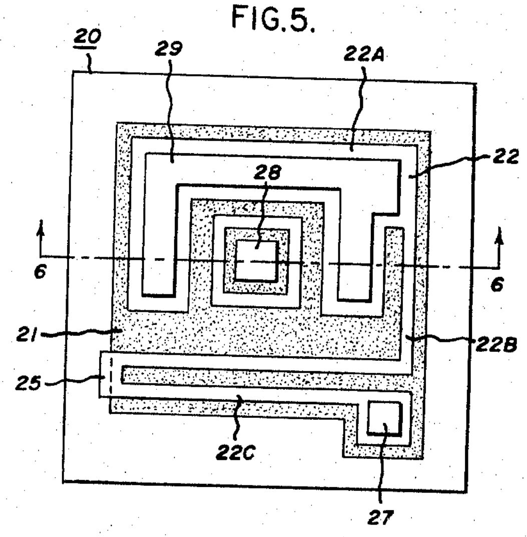
FIGURE 5 shows a top view of one form of a PN unijunction transistor analogue device according to this invention.
Figure 6:
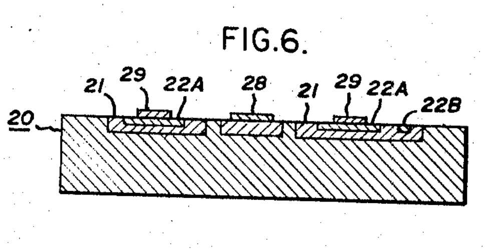
Figure 7:
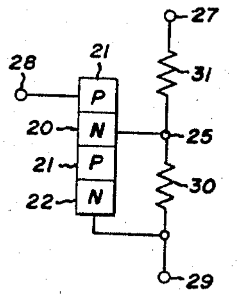
Figure 8:
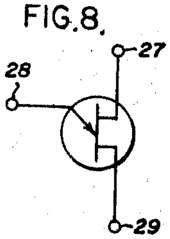

FIGURE 6 shows a sectional view of the device shown in FIGURE 5, taken on the line 6—6 thereof; and FIGURES 7 and 8 show the equivalent circuit of the divice shown in FIGURES 5 and 6 and its unijunction transistor analogue.

Figure 1:
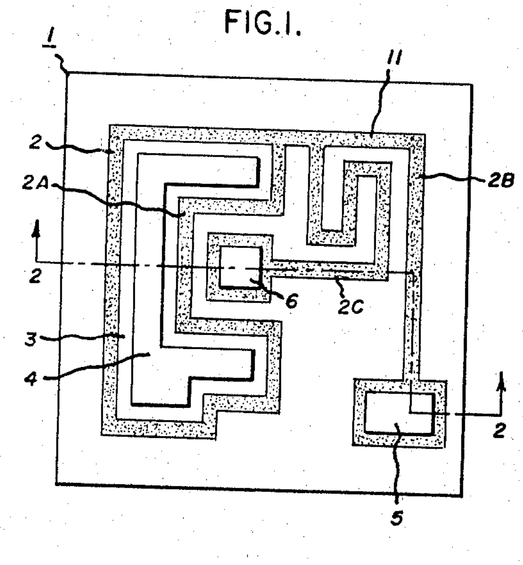
FIGURE 1 shows a top view of one form of an NP unijunction analogue device according to this invention.
Figure 2:
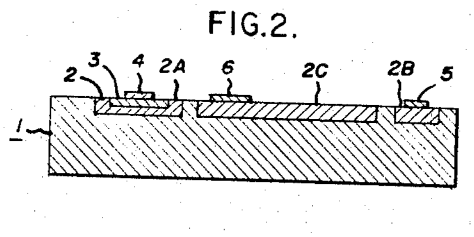
FIGURE 2 shows a sectional view of the device of FIGURE 1, taken on the line 2—2 thereof.

Referring now to FIGURES 1 and 2, a wafer of N-type semiconductor material 1 such as silicon is shown including a first layer 2 of P-type conductivity, which may be formed for example by diffusion. The P-type layer 2 is made in the N-type semiconductor wafer in the areas defined by the dotted portions shown in FIGURE 1. Diffusion of layer 2 may be carried out in a commercially known manner and does not need a detailed description for purposes of understanding this invention. An oxidation masking process such as presently known in the art is one suitable manner of performing such diffusion process.

After the P-type impurities have been introduced into the block of N-type silicon material, an N-type region 3 is similarly formed, as shown in FIGURES 1 and 2, and, as may be seen, is completely enclosed by a first section of the N-type diffusion 2. After formation of N-type region 3 is carried out, non-rectifying contacts, of a suitable metal such as aluminum, designated by reference numerals 4, 5 and 6 may be deposited on the device. This step may be carried out by a well-known evaporation technique and once again no detailed description of this technique is deemed necessary.

It will be noted in FIGURE 1 that the layer 2 of P-type material comprises three distinct sections, 2A, 2B and 2C.

The first section 2A is that which totally encloses the N-type region 3 formed in the device. The second and third sections of the P-type material comprise a pair of narrow extended sections 2B and 2C as shown in FIGURE 1. The sections 2B and 2C, while forming a PN junction with the silicon wafer 1, also have inherent resistance, the magnitudes of which are determined in a large part by their extent. Thus, as can be seen in FIGURE 1, the sections 2B and 2C comprise a pair of resistances electrically connected in series. Both sections 2B and 2C are terminated at their extremities by the aluminum contacts 5 and 6 respectively. The aluminum contact 4 is deposited on the second diffused layer of N-type material.

Figure 3:
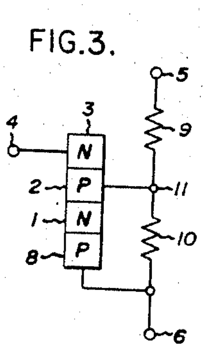
FIGURES 3 and 4 show the equivalent circuit of the device shown in FIGURES 1 and 2 and its unijunction transistor analogue.

The resulting device is electrically equivalent to the circuit shown in FIGURE 3. The aluminum contact 4 is connected to the layer of N-type material 3, which layer forms a semiconductor NP junction with the first section of the diffused layer of P-type material 2. This section of the layer of P-type material forms a PN semiconductor junction with the N-type silicon wafer 1. Relatively close to this latter junction, the silicon wafer 1 forms an NP semiconductor junction with the extreme end of the third section 8 of the P-type diffusion layer 2. The closer the end of section 8 is spaced to the PN junction of regions 3 and 4, the lower will be the emitter saturation voltage. However, spacing of the junction of regions 2 and 1 from the junction of regions 1 and 8 must be sufficient to prevent depletion layer reach-through and resulting undesired switching of the device to the conducting state.

The sections 2B and 2C, and the inherent resistances 9 and 10 constituted thereby, join together at a common point 11 indicated near the upper right-hand corner of the device illustrated in FIGURE 1. Since the common point 11 is physically close to the first section 2A of the P layer, common point 11 is shown in FIGURE 3 to be in essentially direct electrical contact with this first section 2A of the layer 2. The end of the section 2C remote from common point 11 carries contact 6 and comprises P-type material constituting a fourth layer of the semiconductor device which is physically positioned in the silicon wafer 1 near enough to the first section 2A of the P-layer 2 to permit minority carrier flow between regions 2A and 2C through the intervening portion of region 1. The corresponding end of the resistance 10 constituted by section 2C is, as shown in FIGURE 3, in direct contact with the contact 6. The extremities of the resistances 9 and 10 terminate at the aluminum contacts 5 and 6 respectively.

Figure 4:
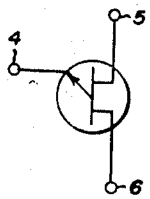

As is evident in FIGURE 3, the equivalent circuit of the device of FIGURES 1 and 2 comprises a specially designed PNPN transistor with a resistance divider connected thereto. This circuit has been found to be an electrical analogue of the unijunction transistor shown in FIGURE 4, in terms of such properties as voltage-current characteristics, and response to temperature change. The intrinsic standoff ratio of the equivalent device is determined by the ratio of the resistor 10 to the combination of the resistors 9 and 10, and the inter-base resistance is the sum of the resistances 9 and 10. The terminal 4 comprises the emitter electrode while the terminals 5 and 6 comprise the base two and the base one electrodes respectively.

By designing the two sections 2B and 2C of the P-layer 2 such that the widths of these sections are the same, the resistance of these sections, and therefore the intrinsic standoff ratio, is determined by the length of these two sections. Thus by controlling these respective lengths to very close tolerances, which is relatively easy to do in the manufacture of semiconductor devices, a greater uniformity in the intrinsic standoff ratio from device to device can be achieved.

Conventional unijunction transistors formed by masked or unmasked impurity diffusion or alloying techniques usually are formed with the base one and base two electrodes at a relatively large distance away from the emitter junction. In such a unit the size of the base one region and the spacing between the emitter electrode and the base one electrode determines the intrinsic standoff ratio. Since both of these factors are partly determined by each other, it is very difficult to control them btoh so that the standoff ratio is uniform from unit to unit. In a specific embodiment it has been shown that while a conventional unijunction transistor could not achieve any better than ±10% variance in standoff ratios, the device according to the present invention achieved a standoff ratio of 0.59±0.15%.

By virtue of the fact that the device according to the present invention is comparable to a diffused four-layer transistor, and since the resistivity of the semiconductor material at the diode junction (i.e. junction between regions 3 and 2) of such a device can be much lower than in unijunction devices heretofore available, the dynamic resistance of the device and the emitter saturation voltage can be very low as compared to a unijunction transistor heretofore available. Also, the lower saturation voltage allows more uniformity in this characteristic from unit to unit. In addition, the fact that the spacings between the junctions are much smaller enables the switching speeds achievable to be very much faster than in previous devices. In one specific embodiment it was found that by means of this invention the dynamic resistance approached as low as 1 ohm, thereby lowering the emitter saturation voltage by as much as 40% over prior art devices. The rise time of current through the emitter junction, i.e. the junction between regions 3 and 2, was decreased from 200 ns. in prior devices to 50 ns. in the present device. Other additional features obtained by means of this invention were that the stability of the device with temperature variation was much greater since stability is determined by the standoff ratio. For example, when connected as an oscillator, changes in frequency with temperature were measured at less than 0.1% in the device of this invention whereas with conventional devices stability was usually ten times worse.

Referring now to FIGURES 5 and 6, a complementary PN device to the NP device shown in FIGURE 1 is illustrated. In the device of FIGURES 5 and 6, an N-type silicon wafer 20 has provided therein a first layer 21 of p-type material. A second layer 22 of N-type material is formed within the first layer of p-type material and comprises a first section 22A of a relatively wide expanse and a second section 22B which is relatively narrow and of considerable length. The second section 22B of the second layer of N-type material overlaps the silicon wafer 20 of N-type material at a position 25. A third section 22C of the second diffused layer of N-type material 22 extends from the overlapping point 25 to a terminus where a non-rectifying base two contact 27 of aluminum or the like is applied. Another such contact 28 is applied on a central portion of the first layer 21 of p-type material and a third such contact 29 is applied on the first section 23 of the N-type layer 22.

The equivalent circuit of the device illustrated in FIGURES 5 and 6 is shown in FIGURE 7. In FIGURE 7, terminal 28, which is the emitter electrode terminal, is connected to the central portion of the first layer of p-type material 21. This central portion of p-type material forms a PN junction with the N-type silicon wafer 20. The remaining portions of the first layer of N-type material 21 form an NP junction with the N-type silicon wafer 20 and also a PN junction with the second layer of N-type material 22. The second and third sections 22B and 22C of the second diffused N-type layer 22 constitute a pair of inherent resistances 30 and 31 respectively which are electrically connected together at the common point 25, thereby forming a resistance divider. By means of the overlap between the N-type silicon wafer 20 and the second N-type layer 22 at the common point 25, an electrical connection is made between the silicon wafer 20 and the common point 25 of the resistance divider. The contact 29 forms the base one electrode of the equivalent circuit of FIGURE 7, while the contact 27 forms the base two electrode.

The equivalent circuit of FIGURE 7 is an analogue of the unijunction transistor illustrated in FIGURE 8 which includes an emitter electrode 28 and a base one and base two electrode 29 and 27 respectively.

As with respect to the device of FIGURES 1 and 2, by holding the widths of the second and third sections 22B and 22C of the N-type layer 22 constant and by controlling their relative lengths to close tolerances, the ratio of the resistances 30 and 31 can be accurately controlled. Thus the intrinsic standoff ratio or the ratio of the resistance 30 to the inter-base resistance 30 plus 31 can likewise be accurately controlled.

The other advantages gained by means of this invention, as described in relation to FIGURES 1 and 2, are also gained in the device illustrated in FIGURES 5 and 6. It will be apparent that complementary unijunction devices may be obtained which are very similar to each other in their characteristics and, therefore, quite comparable.

Although this invention has been described in terms of specific embodiments, it is not intended that the invention be limited to the embodiments described, but rather should be given the full extent of coverage as defined in the appended claims.

What I claim as new and desire to secure by Letters Patent of the United States is:

1. An analogue unijunction transistor comprising,
(a) a four layer semiconductor device, adjacent layers being doped with opposite type impurities,
(b) an emitter electrode connected to a first end layer of said four layer device,
(c) a first resistance, the ends of which are respectively connected to two layers of said four layer device, said two layers being of an impurity type opposite that of said first end layer,
(d) a second resistance, one end of which is connected to the common point between said first resistance and the internal layer to which said first resistance is connected,
(e) a base one electrode connected to the end of said first resistance opposite from said common point, and
(f) a base two electrode connected to the end of said second resistance opposite from said common point.

2. An analogue unijunction transistor device comprising, a four layer semiconductor device, adjacent layers being doped with opposite type impurities, an emitter electrode connected to a first end layer of said four layer device, the other end layer and the layer of like conductivity thereto having inherent resistances and being constructed and arranged to comprise a resistive voltage divider, said inherent resistive voltage divider having a first end in ohmic contact with said other end layer and with a base one electrode, said resistive divider having a common point in ohmic contact with said layer of the same conductivity as said other end layer, and said resistive divider having a second end terminating in a base two electrode.

3. An analogue unijunction transistor device comprising:
(a) an N-type silicon wafer,
(b) a first layer of P-type silicon diffused into said silicon wafer, said first layer comprising a controlled raito resistance divider,
(c) a second layer of N-type silicon diffused into said first layer,
(d) an emitter, a base one and a base two electrode, said emitter electrode electrically connected to said second layer, said base one electrode electrically connected to a first end of said resistance divider, said base two electrode being connected to a second end of said resistance divider,
(e) said first end of said resistance divider terminating in said silicon wafer at a position physically close to said second layer relative to said second end of said resistance divider and within the reach of minority carrier flow between said second layer and said first end through the intervening N region.

4. An analogue unijunction transistor device as defined in claim 2, wherein said first layer comprises first, second and third discrete sections electrically connected together at a common point, said second layer being diffused entirely within said first section, and said second sections comprising said resistance divider.

5. An analogue unijunction transistor device as defined in claim 3, wherein said second and third sections are of equal width and depth so that their ratio is determined by their respective lengths.

6. An analogue unijunction transistor device as defined in claim 1, wherein said emitter, base one and base two electrodes comprise aluminum contacts.

7. An analogue unijunction transistor device comprising:
(a) an N-type semiconductor wafer,
(b) a first layer of P-type semiconductor diffused into said semiconductor wafer,
(c) a second layer of N-type semiconductor diffused into said first layer and comprising a resistance divider, the common point of which is in ohmic contact with said semiconductor wafer,
(d) an emitter, a base one and a base two electrode, said emitter electrode electrically connected to said first layer, said base one electrode electrically connected to a first end of said resistance divider, said base two electrode electrically connected to a second end of said resistance divider,
(e) said first end of said resistnace divider being spaced physically closed to the portion of said first layer into which said emitter electrode is electrically connected relative to the spacing of said second end of said resistance divider, said first end and said first layer being spaced close enough for minority carrier flow therebetween through the intervening semiconductor material.

8. An analogue unijunction transistor device as defined in claim 7, wherein said second layer comprises first and second discrete sections electrically connected at said common point, said first and second sections comprising said resistance divider.

9. An analogue unijunction transistor device as defined in claim 8, wherein said first and second sections are of equal width and depth such that their ratio is determined by their respective lengths.

References Cited

UNITED STATES PATENTS

| | | | |
|---|---|---|---|
| 3,253,196 | 5/1966 | Sylvan | 317—234 |
| 3,284,643 | 11/1966 | Menoret et al. | 317—301 X |
| 3,293,449 | 12/1966 | Gutzwiller | 317—301 X |

JOHN W. HUCKERT, *Primary Examiner.*

R. F. POLISSACK, *Assistant Examiner.*

U.S. Cl. X.R.

317—234; 307—299, 310

U.S. DEPARTMENT OF COMMERCE

PATENT OFFICE

Washington, D.C. 20231

UNITED STATES PATENT OFFICE

CERTIFICATE OF CORRECTION

Patent No. 3,439,237 April 15, 1969

Tage P. Sylvan

It is certified that error appears in the above identified patent and that said Letters Patent are hereby corrected as shown below:

Column 5, line 68, "raito" should read -- ratio --. Column 6, line 18, before "sections" insert -- and third --; line 41, "resistnace" should read -- resistance --.

Signed and sealed this 21st day of April 1970.

(SEAL)
Attest:

Edward M. Fletcher, Jr.
Attesting Officer

WILLIAM E. SCHUYLER, JR
Commissioner of Patents